US010879083B2

(12) United States Patent
Maitrejean et al.

(10) Patent No.: US 10,879,083 B2
(45) Date of Patent: Dec. 29, 2020

(54) METHOD FOR MODIFYING THE STRAIN STATE OF A BLOCK OF A SEMICONDUCTING MATERIAL

(71) Applicant: COMMISSARIAT A L'ENERGIE ATOMIQUE ET AUX ENE ALT, Paris (FR)

(72) Inventors: Sylvain Maitrejean, Grenoble (FR); Shay Reboh, Sassenage (FR); Romain Wacquez, Albany, NY (US)

(73) Assignee: Commissariat á l'énergie atomique et aux énergies alternatives, Paris (FR)

( * ) Notice: Subject to any disclaimer, the term of this patent is extended or adjusted under 35 U.S.C. 154(b) by 411 days.

(21) Appl. No.: 14/575,329

(22) Filed: Dec. 18, 2014

(65) Prior Publication Data
US 2015/0179474 A1    Jun. 25, 2015

(30) Foreign Application Priority Data
Dec. 23, 2013  (FR) ..................... 13 63419

(51) Int. Cl.
*H01L 21/324* (2006.01)
*H01L 21/02* (2006.01)
*H01L 29/78* (2006.01)
*H01L 21/265* (2006.01)

(52) U.S. Cl.
CPC ...... *H01L 21/324* (2013.01); *H01L 21/02532* (2013.01); *H01L 21/02667* (2013.01); *H01L 29/7847* (2013.01); *H01L 21/26506* (2013.01)

(58) Field of Classification Search
CPC .................. H01L 29/7847; H01L 21/02667
See application file for complete search history.

(56) References Cited

U.S. PATENT DOCUMENTS

| 4,826,737 A * | 5/1989 | Yamada | C22C 21/06 148/522 |
| 6,197,623 B1 * | 3/2001 | Joo | H01L 21/2026 257/E21.134 |
| 6,348,715 B1 * | 2/2002 | Son | H01L 27/1203 257/353 |

(Continued)

OTHER PUBLICATIONS

"Creep Deformation in Materials" by the Academic Resource Center, Tay-Jeng Chu, Oct. 5, 2012 (according to PDF metadata), retrieved from https://web.iit.edu/sites/web/files/departments/academic-affairs/academic-resource-center/pdfs/MaterialsCreep.pdf.*

(Continued)

*Primary Examiner* — Kevin Parendo
(74) *Attorney, Agent, or Firm* — Oblon, McClelland, Maier & Neustadt, L.L.P.

(57) ABSTRACT

A method is provided for modifying a strain state of a block of a semiconducting material having a crystalline structure, including steps in the following order: a) forming an amorphous lower region in the block of semiconducting material resting on a substrate amorphous, while maintaining the crystalline structure of an upper region of the block, which is in contact with the lower region; b) performing at least one creep annealing of the block with a suitable duration and temperature so that creep occurs in the lower region and without recrystallizing the material of this lower region; and c) performing at least one recrystallization annealing of the lower region of the block.

11 Claims, 8 Drawing Sheets

(56) References Cited

U.S. PATENT DOCUMENTS

| | | | |
|---|---|---|---|
| 2008/0169508 A1 | 7/2008 | Chidambarrao et al. | |
| 2009/0087971 A1 | 4/2009 | Colombeau et al. | |
| 2009/0233455 A1* | 9/2009 | Dyer | H01L 21/28035 438/795 |
| 2011/0291100 A1 | 12/2011 | Cheng et al. | |
| 2012/0068267 A1* | 3/2012 | Bedell | H01L 21/84 257/350 |
| 2012/0279299 A1* | 11/2012 | Walther | G01C 19/5762 73/504.02 |
| 2014/0061798 A1 | 3/2014 | Vinet et al. | |

OTHER PUBLICATIONS

"Does glass creep", Physics Today, Jun. 1962.*
U.S. Appl. No. 14/849,060, filed Sep. 9, 2015, Maitrejean, et al.
U.S. Appl. No. 14/441,354, filed May 7, 2015, Vinet, et al.
U.S. Appl. No. 14/017,583, filed Sep. 4, 2013, 2014-0061798, Vinet, et al.
U.S. Appl. No. 14/555,897, filed Nov. 28, 2014, Reboh, et al.
U.S. Appl. No. 14/579,069, filed Dec. 22, 2014, Reboh, et al.
U.S. Appl. No. 14/425,977, filed Mar. 4, 2015, Vinet, et al.
U.S. Appl. No. 14/425,891, filed Mar. 4, 2015, Grenouillet, et al.
Tzer-Min Shen et al., "Molecular Dynamic Simulation Study of Stress Memorization in Si Dislocations", Electron Devices Meeting (IEDM), Dec. 2012, 4 pages.
Olof Hellman, "Topics in Solid Phase Epitaxy: Strain, Structure and Geometry", Materials Science and Engineering, vol. 16, Issue 1, 1996, 42 pages.
French Preliminary Search Report dated Sep. 30, 2014, in French Application No. 13 63419 filed Dec. 23, 2013 (with English Translation of Categories of Cited Documents).
C. Gallon, et al., "Electrical Analysis of Mechanical Stress Induced by STI in Short MOSFETs Using Externally Applied Stress", IEEE Transactions on Electron Devices, vol. 51, No. 8, Aug. 2004, 8 pgs.
Ann Witvrouw, et al., "Viscosity and elastic constants of amorphous Si and Ge", Journal of Applied Physics, vol. 74, No. 12, Dec. 15, 1993, 8 pgs.
V. Vavrunkova, et al., "Study of Re-crystallization Processes in Amorphous Silicon Films", 27th International Conference on Microelectronics (MIEL 2010), May 16-19, 2010, 4 pgs.
U.S. Appl. No. 14/791,713, filed Jul. 6, 2015, Reboh, et al.

* cited by examiner

US 10,879,083 B2

METHOD FOR MODIFYING THE STRAIN STATE OF A BLOCK OF A SEMICONDUCTING MATERIAL

TECHNICAL FIELD AND PRIOR ART

This description relates to the field of semiconducting structures and more particularly methods of making such structures comprising one or several steps aimed at modifying the state of strain of a semiconducting material block.

It may be advantageous to form some microelectronic components and particularly transistors partly in a layer of semiconducting material having a mechanical tensile or compressive strain is applied, in order to improve their performances.

For example, a tensile strained silicon transistor channel may have an increased electron speed while a compressive strained silicon channel may have an increased conduction by holes.

It is known that a strain can be applied on a block of semiconducting material by forming an amorphous material with an intrinsic strain on this block.

For example, document US2008/0169508 A1 discloses a method in which a block of Si is stressed by a layer of tensile silicon nitride, while another Si block on the same substrate is strained by a layer of compressive silicon nitride.

Another method for straining a semiconducting material consists of imposing the mesh parameter of another semiconducting material on it.

For example, document US 2012/0068267 A1 discloses a process in which such a method is used; a local implantation of an Si block on top of which an SiGe zone is made to make a lower region of the Si block amorphous and to relax this region.

The upper region of the Si block is affected by a stress imposed by the SiGe zone. The next step is to recrystallize the lower region of the Si block making use of the upper region of this block as an initial germ. The stressed material in the upper region then imposes its own mesh parameter on the material in the lower region.

In some cases, it may be desirable to reduce the strain in a block of semiconducting material.

For example, when a device with N type transistors and P type transistors is made from a tensile prestrained single semiconducting layer of a substrate, it may be required to relax some zones of the pre-strained layer locally in order to fabricate the P type transistors.

The problem arises of finding a new method for modifying the state of a strained semiconducting block.

PRESENTATION OF THE INVENTION

According to a possible embodiment, this invention provides a method comprising steps consisting of:

a) making a lower region of a block of semiconducting material resting on an amorphous substrate, while the crystalline structure of an upper region of the block in contact with the lower region is maintained, b) making at least one creep annealing with a duration and a temperature adapted to enable creep of the lower region without recrystallizing the material of this lower region, c) making at least one recrystallization annealing of the lower region.

Thus according to the invention, the creep annealing can modify the strain state of the semiconducting block more than a method in which a recrystallization is done directly after having rendered the lower region of this block amorphous.

The method may be applied to relax a block of strained semiconducting material or to strain a block of unstrained or relaxed semiconducting material, or to increase the strain in a block of strained semiconducting material.

Thus according to one first embodiment of the method, the block of semiconducting material may be a strained block in step a).

This semiconducting block may have been formed from or may form part of a superficial layer of a semiconducting on insulator type substrate or a semiconducting on insulator type of substrate.

According to one possible embodiment of the method, trenches are formed in the insulating layer on each side of the semiconducting block.

This step may be done before or after amorphization.

A step may be added between step a) and step b) consisting of forming a stressing zone of the block of semiconducting material.

The zone in which the block of semiconducting material is stressed may be based on a strained amorphous material, for example such as strained silicon nitride.

According to one possible embodiment of the method in which said semiconducting block is based on Si, the creep annealing in step b) may be done at a temperature between 300° C. and 400° C.

A method like that defined above may be implemented in the fabrication of a microelectronic transistor device.

BRIEF DESCRIPTION OF THE DRAWINGS

This invention will be better understood after reading the description of example embodiments given purely for information and that is in no way limitative with reference to the appended drawings in which.

As is standard practice in representing semiconducting structures, the various sectional views are not drawn to scale. The different parts shown in the figures are not necessarily all at the same scale to make the figures more easily readable, the angles formed by the side faces of the different layers being used particularly to show the different strain states of these layers.

Furthermore in the following description, terms that depend on the orientation of a structure such as "lower" and "upper" are applicable considering that the structure is oriented in the manner shown in the figures.

DETAILED PRESENTATION OF PARTICULAR EMBODIMENTS

A first example of a method according to the invention that can modify the strain state of a semiconducting block will now be disclosed with reference to FIGS. 1A-1D.

Figure 1A:
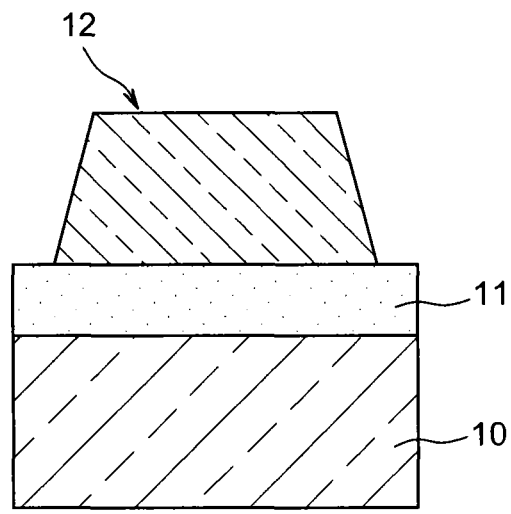
FIGS. 1A-1D show an example method designed to reduce the strain state of a strained semiconducting block and in which at least one creep annealing of the semiconducting block is done according to the invention.
Figure 1B:
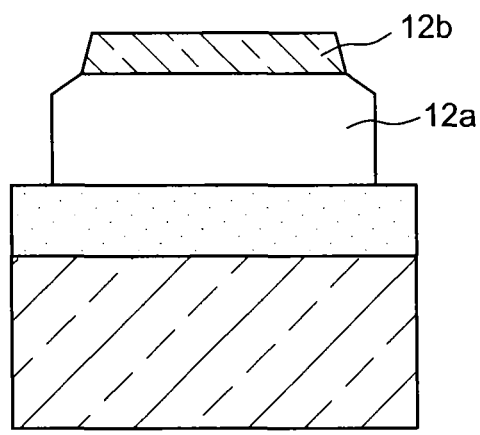

In this example, the initial material for this method is a strained semiconducting on insulator type substrate, for example of the sSOI (strained silicon on insulator") type. The substrate thus comprises a support layer 10 for example a semiconducting layer that may be based on Si and an insulating layer 11, for example based on silicon oxide located on and in contact with the support layer 10 and a so-called "superficial" semiconducting layer located on and in contact with said insulating layer 11 and that is strained, for example tensile strained (FIG. 1A). For example, the strained superficial semiconducting layer may be between 10 nm and 200 nm, and preferably between 15 nm and 40 nm thick.

An ionic implantation (FIG. 1B) is then made of a semiconducting block 12 of the superficial layer that can have been obtained by etching this superficial layer.

The implantation is made so as to make a lower region 12a of the semiconducting block 12 amorphous. The implantation profile is such that the upper region 12b maintains its crystalline structure. The upper region receives a dose less than the amorphization threshold that is usually of the order of 10% of atoms displaced in a crystal, namely about $3.6E^{21}$ atoms·cm$^{-3}$ in crystalline Si.

In this particular example, the lower region 12a made amorphous is in contact with the insulating layer 12 of the substrate, while a crystalline germ is kept on the surface of the semiconducting block 12.

The ionic implantation species is preferably a lightweight species. The amorphizing implantation may be made by means of an inert species for the implanted semiconducting material, for example Si atoms when the semiconducting material that is implanted is Si. In this case an "inert species" refers to a species that will not modify the conducting properties of the implanted semiconducting material.

The amorphizing implantation conditions of the semiconducting block 12 may be defined using a simulation tool for example such as C-TRIM (CTRIM for "Crystal Transport of Ions in Matter") type software using Monte Carlo algorithms. If a 30 nm thick region of an Si block 12 is implanted, the implantation energy may for example be between 15 keV and 30 keV, for example with an implantation dose of between $1^E14$ and $8^E14$ atoms/cm$^2$.

For an implantation of an Si block, a dose for example equal to approximately $4^E14$ with an energy for example of the order of 20 keV or a dose for example of the order of $3^E14$ with an energy for example of the order of 30 keV can be used to make a stack comprising an amorphous lower region of the order of 20 nm thick above which there is an upper crystalline region of the order of 10 nm thick.

Figure 1C:
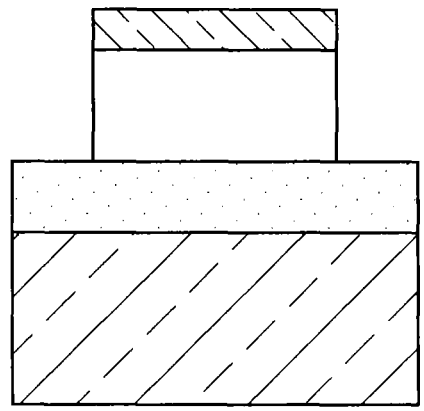

A creep annealing is then done (FIG. 1C).

The creep annealing is done at a temperature and for a duration chosen to enable the lower amorphous region 12a to creep, while preventing recrystallization of this region.

The temperature of this creep annealing is thus chosen to be lower than the recrystallization temperature of the semiconducting material of the semiconducting block 12, for example less than 500° C. when the semiconducting block 12 is based on Si.

For example in the case of a block 12 based on another semiconducting material such as $Si_xGe_{1-x}$ or Ge, the creep temperature may be chosen as a function for example of recrystallization temperature data like those described in a document by O. Hellman, Materials Science and Engineering: R: Reports Volume 16, Issue 1, 1996.

The thermal budget for the creep annealing is also designed to be sufficiently high to enable relaxation of the initially strained lower region 12b of the semiconducting block 12, and particularly a relaxation such that the lower region 12b of the semiconducting block 12 is affected by a stress variation of at least 300 MPa.

For example, the document "viscosity and elastic constants of amorphous Si and Ge" by Witvrouw et al., Journal of Applied Physics 74,1993 gives conditions for the relaxation of Si.

Based on the data in the previous document, a table can be determined providing results of stress measurements as a function of an annealing duration applied on an Si block after a creep annealing has been done on the Si block at a temperature chosen of the order of 350° C. A creep annealing lasting for the order of 1 hour may be done to relax this Si semiconducting block with an initial stress for example of the order of 1 GPa.

| t (s) | sigma (Mpa) |
|---|---|
| 0 | 1000 |
| 1 | 999 |
| 2 | 999 |
| 3 | 998 |
| 4 | 998 |
| 5 | 997 |
| 10 | 994 |
| 60 | 966 |
| 120 | 932 |
| 600 | 705 |
| 1200 | 497 |
| 3600 | 122 |

A second table below gives a correspondence between the annealing temperature of a block of Si and the annealing duration necessary to enable creep with an associated viscosity value.

| T (° C.) | viscosite (pa · s) | tcarac (s) |
|---|---|---|
| 200 | 1.3E+18 | 5E+07 |
| 225 | 1.5E+17 | 6E+06 |
| 250 | 2.1E+16 | 9E+05 |
| 275 | 3.5E+15 | 1E+05 |
| 300 | 6.9E+14 | 3E+04 |
| 325 | 1.6E+14 | 7E+03 |
| 350 | 4.0E+13 | 2E+03 |
| 375 | 1.2E+13 | 5E+02 |
| 400 | 3.6E+12 | 2E+02 |
| 425 | 1.2E+12 | 5E+01 |
| 450 | 4.5E+11 | 2E+01 |
| 475 | 1.8E+11 | 8E+00 |
| 500 | 7.5E+10 | 3E+00 |
| 525 | 3.3E+10 | 1E+00 |
| 550 | 1.5E+10 | 7E-01 |
| 575 | 7.6E+09 | 3E-01 |
| 600 | 3.8E+09 | 2E-01 |
| 625 | 2.0E+09 | 9E-02 |
| 650 | 1.1E+09 | 5E-02 |

An annealing temperature equal to at least 300° C. is preferable to maintain a reasonable annealing duration relative to industrially applied stresses.

When the block 12 is based on Si, the creep annealing temperature may thus advantageously be chosen between 300° C. and 400° C. while the duration may be fixed for example between several tens of seconds and several hours.

Figure 1D:
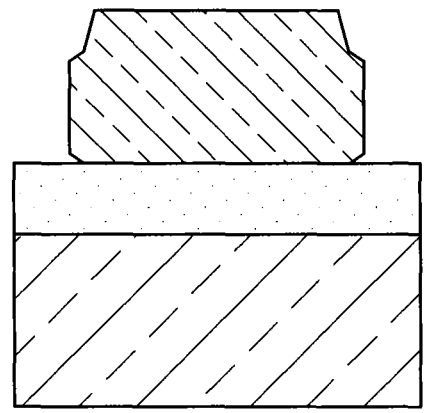

Then, after performing the creep annealing, a recrystallization annealing is made on the lower region 12a of the semiconducting block 12, using the upper region 12b of the semiconducting block as the initial zone for a recrystallization front (FIG. 1D).

In order to recrystallize the semiconducting block 12 when it is based on Si, annealing is done at a temperature preferably more than 500° C., that may for example be between 600° C. and 1150° C. The annealing duration may for example be more than 2 minutes for an annealing temperature of the order of 600° C. Since a high thermal budget gives better recrystallization, annealing at a temperature of the order of 1100° C. for a duration of 30 minutes can advantageously be used.

Figure 2:
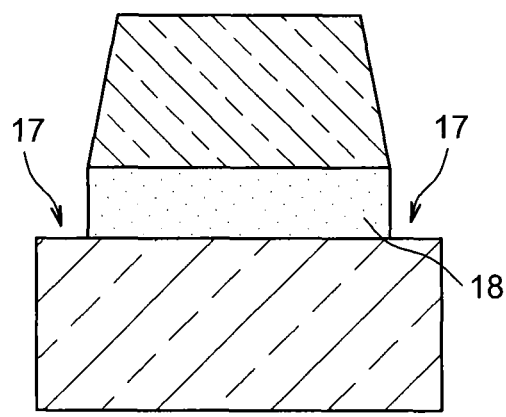
FIG. 2 shows a variant of the method in which the semiconducting block is supported on an etched insulating zone.

According to one variant embodiment shown in FIG. 2, during the formation of the semiconducting block 12 by etching the superficial layer, this etching can be extended in the insulating layer 11 stopping on or in the support layer 10. The result is that trenches 17 are formed on each side of the semiconducting block 12 around a zone 18 of the insulating layer of the substrate on which this block is supported. The edges of the insulating zone 18 in this case are located along the extension of the lateral flanks of the semiconducting block.

This may make it possible to further modify stresses applied on the semiconducting block.

As a variant, these trenches may be formed after amorphization. In this case, the etching conditions, and particularly the temperature, are selected so that the block will not be crystallized.

Another example process according to the invention is shown in FIGS. 3A-3E. In this case, this method is aimed at increasing the strain state of a semiconducting block.

In this example, the initial material is a semiconducting on insulator type substrate, for example an SOI (silicon on insulator) type that is different from that in the previous example in that the surface semiconducting layer 12 located on and in contact with the insulating layer 11 in this case does not have any intrinsic strain.

Figure 3A:
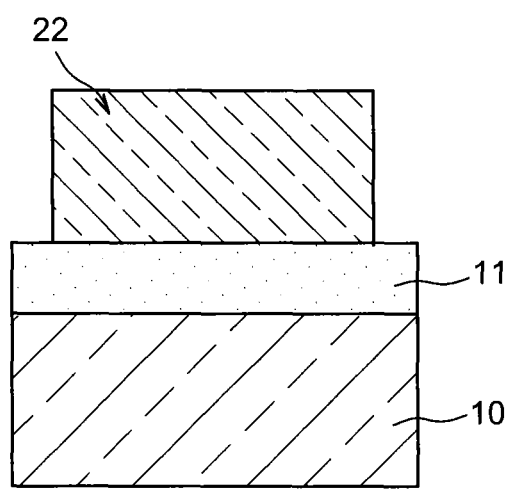
FIGS. 3A-3E show another example method according to the invention consisting of stressing a strained semiconducting block and in which at least one creep annealing of the semiconducting block is done according to the invention.
Figure 3B:
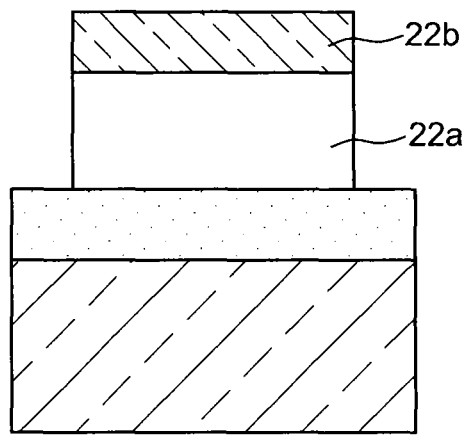
Figure 3C:
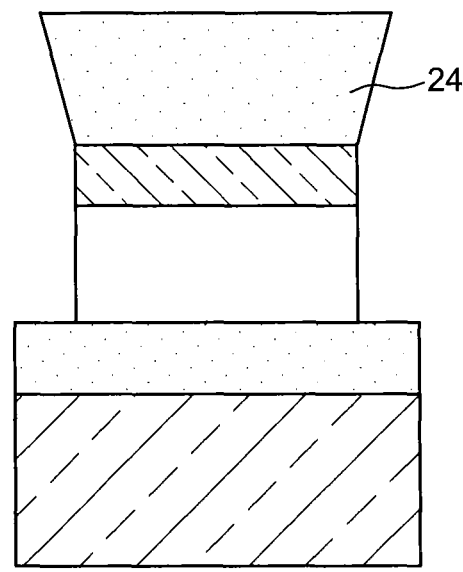

The next step is an ion implantation that makes a lower region 22a of a semiconducting block 22 of the superficial semiconducting layer amorphous while maintaining the crystalline structure of an upper region 22b of this block (FIG. 3B).

The next step is to form a straining zone 24 on the upper region 22b of the semiconducting block. The straining zone 24 may be based on a strained amorphous material, for example such as $Si_xN_y$. The straining zone 24 may for example be based on $Si_xN_y$ strained in compression in order to strain the semiconducting block 22 in tension.

Figure 3D:
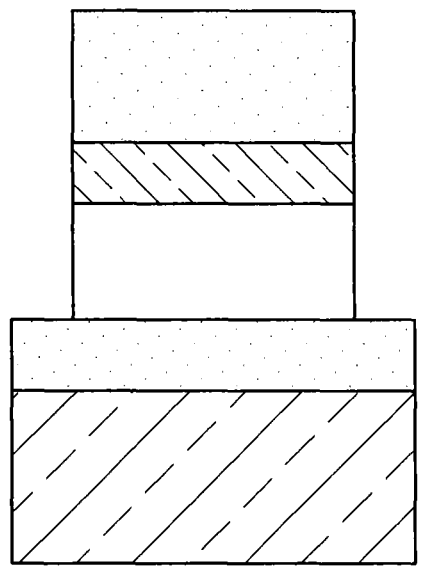

The next step is a creep annealing with a sufficient thermal budget so that the region made amorphous 22b can creep and designed so that this region is not recrystallized (FIG. 3D).

This creep annealing is done at a temperature below the recrystallization temperature of the semiconducting material of the block 12 and sufficiently high so that this semiconducting material can relax. In the case of a semiconducting block 12 based on Si, the creep annealing may for example be made at a temperature of between 300° C. and 400° C., with a duration for example of between several seconds and several hours.

The next step is a recrystallization annealing of the lower region 22a of the semiconducting block 22 at a temperature that may for example be between 500° C. and 1150° C. and for example a duration longer than 2 minutes.

Figure 3E:
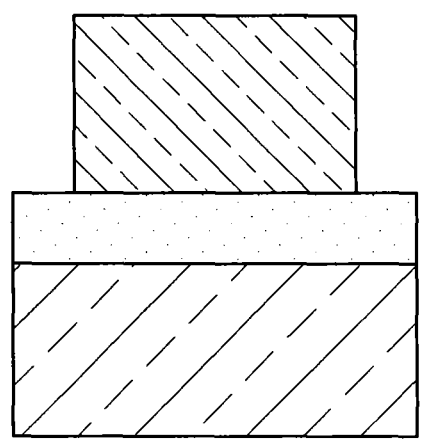

The next step is to remove the straining zone 24 (FIG. 3E). In the case in which this zone is based on $Si_xN_y$, this withdrawal may for example be made by etching using Ortho-phosphoric acid $H_3PO_4$, at a temperature for example of between 50° C. and 100° C.

Figure 4A:
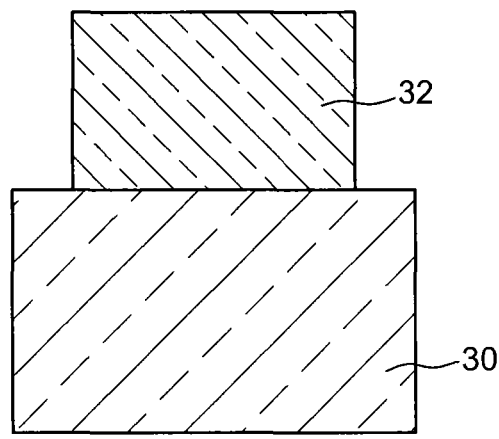
FIGS. 4A-4E show a variant of the method according to the invention implemented on a bulk substrate.

In one variant embodiment, the process as disclosed above is used starting from a bulk substrate 30, for example on which a semiconducting block 32 based on Si is formed (FIG. 4A).

Figure 4B:
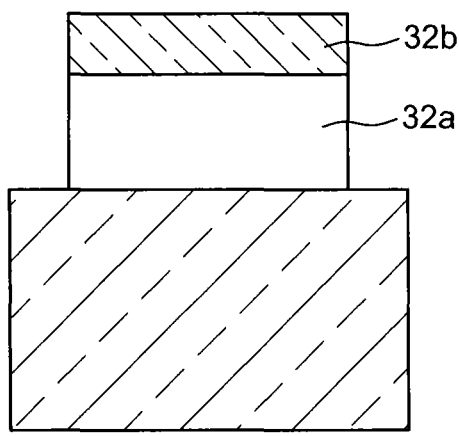

A lower region 32a of the semiconducting block 32 is made amorphous while maintaining the crystalline structure of an upper region 32b of this block (FIG. 4B).

Figure 4C:
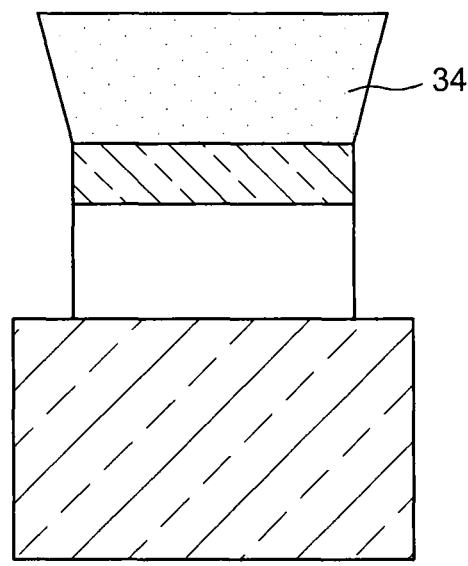

The next step is to form a straining zone 34 on the upper region 32b of the semiconducting block (FIG. 4C). For example, the zone 34 may be a compression zone of the semiconducting block 32 based on silicon nitride.

Figure 4D:
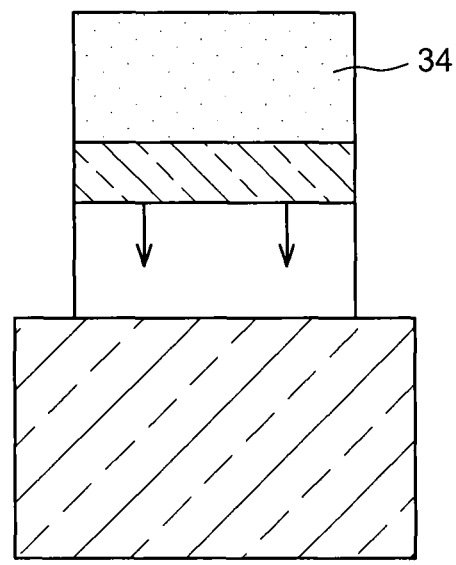

The next step is creep annealing with an adapted temperature and duration pair so that the amorphous lower region 32a can creep without recrystallizing (FIG. 4D). Thus, the thermal budget is made sufficiently low to prevent recrystallization of the lower region 32a and sufficiently high so that this semiconducting material can creep and there can be a stress variation of at least 300 MPa.

In the case of a semiconducting block 12 based on Si, the temperature of this creep annealing may for example be between 300° C. and 400° C., while the annealing duration may for example be between several tens of seconds and several hours.

The next step is a recrystallization annealing of the lower region 32a of the semiconducting block 32 at a temperature that may for example be between 500° C. and 1150° C. for a duration for example of between 2 minutes and several hours.

Figure 4E:
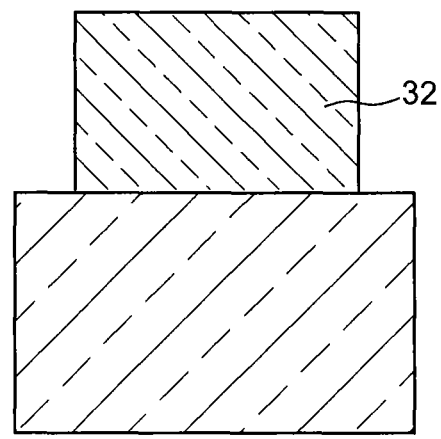

The next step is to remove the straining zone 34 (FIG. 4E).

The invention claimed is:

1. A method for modifying a strain state of a block of a semiconducting material having a crystalline structure, comprising steps in the following order:
    a) forming an amorphous lower region in the block of semiconducting material resting on a substrate, while maintaining the crystalline structure of an upper region of the block, which is in contact with the amorphous lower region;
    b) performing at least one creep annealing of the block with a suitable duration and temperature so that creep occurs in the amorphous lower region and without recrystallizing the semiconducting material of the amorphous lower region; and
    c) performing at least one recrystallization annealing of the amorphous lower region of the block,
    wherein said block of semiconducting material, the lower region of which is made amorphous in step a), is a block of strained semiconducting material.

2. The method according to claim 1, wherein the substrate is a semiconductor on insulator type substrate comprising a support layer, an insulating layer supported on the support layer, and a superficial semiconducting layer supported on the insulating layer, said block of semiconducting material forming part of said superficial semiconducting layer.

3. The method according to claim 2, wherein trenches are formed in the insulating layer on each side of the block of semiconducting material.

4. The method according to claim 1, also comprising a step between step a) and step b) consisting of forming a stressing zone of the block of semiconducting material.

5. The method according to claim 4, wherein the zone in which the block of semiconducting material is strained is based on a strained amorphous material.

6. The method according to claim 1, wherein
    said block of semiconducting material is based on Si, the at least one creep annealing in step b) is performed at a temperature in a range between 300° C. and 400° C., and with a corresponding duration in a range between several hours and several dozens of seconds, and
wherein a relationship between said temperature and said duration is such that values of temperature in the temperature range are a decreasing function of values of duration in the duration range.

7. A method for fabricating a microelectronic transistor device comprising implementation of the method according to claim 1.

8. A method for modifying a strain state of a block of a semiconducting material based on Si and having a crystalline structure, comprising steps in the following order:
 a) forming an amorphous lower region in the block resting on a substrate, while maintaining the crystalline structure of an upper region of the block, which is in contact with the amorphous lower region;
 b) performing a creep annealing of the block with a suitable duration and temperature so that creep occurs in the amorphous lower region and without recrystallizing the semiconducting material of the amorphous lower region; and
 c) performing a recrystallization annealing of the semiconducting material in the amorphous lower region of the block,
wherein said block of semiconducting material, the lower region of which is made amorphous in step a), is a block of strained semiconducting material.

9. The method according to claim 1, wherein the substrate is a semiconductor on insulator type substrate comprising a support layer, an insulating layer supported on the support layer, and a superficial strained semiconducting layer supported on the insulating layer, said block of strained semiconducting material forming part of said superficial strained semiconducting layer.

10. The method according to claim 3, wherein the trenches are formed after forming the amorphous lower region and before the at least one creep annealing.

11. The method according to claim 6,
wherein said block of semiconducting material is based on strained Si,
said creep annealing in step b) being performed so as to reduce strain in said block of semiconducting material by at least 300 MPa.

* * * * *